(12) United States Patent
Moriguchi et al.

(10) Patent No.: US 8,779,478 B2
(45) Date of Patent: Jul. 15, 2014

(54) THIN FILM TRANSISTOR (75) Inventors: Masao Moriguchi, Osaka (JP); Michiko Takei, Osaka (JP); Yohsuke Kanzaki, Osaka (JP); Tsuyoshi Inoue, Osaka (JP); Tetsuo Fukaya, Osaka (JP); Yudai Takanishi, Osaka (JP); Takatsugu Kusumi, Osaka (JP); Yoshiki Nakatani, Osaka (JP); Tetsuya Okamoto, Osaka (JP); Kenji Nakanishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/701,028

(22) PCT Filed: May 23, 2011

(86) PCT No.: PCT/JP2011/002859
§ 371 (c)(1),
(2), (4) Date: Mar. 15, 2013

(87) PCT Pub. No.: WO2011/151990
PCT Pub. Date: Dec. 8, 2011

(65) Prior Publication Data
US 2013/0175521 A1  Jul. 11, 2013

(30) Foreign Application Priority Data
Jun. 1, 2010  (JP) ................. 2010-125655

(51) Int. Cl.
*H01L 29/76* (2006.01)
*H01L 29/66* (2006.01)
*H01L 29/786* (2006.01)
*H01L 29/24* (2006.01)

(52) U.S. Cl.
CPC ...... *H01L 29/7869* (2013.01); *H01L 29/66742* (2013.01); *H01L 29/78618* (2013.01); *H01L 29/78696* (2013.01); *H01L 29/24* (2013.01)
USPC ............... 257/288; 257/43; 257/E29.296

(58) Field of Classification Search
USPC .................. 257/43, 288, E29.296
See application file for complete search history.

(56) References Cited

U.S. PATENT DOCUMENTS

2005/0017302 A1*  1/2005  Hoffman ............... 257/347
2009/0045397 A1  2/2009  Iwasaki (Continued)

FOREIGN PATENT DOCUMENTS

JP  2009-099944 A  5/2009
JP  2011-091376 A  5/2011

(Continued)

OTHER PUBLICATIONS

Official Communication issued in International Patent Application No. PCT/JP2011/002859, mailed on Jun. 28, 2011.

*Primary Examiner* — Zandra Smith
*Assistant Examiner* — Jamie C Niesz
(74) *Attorney, Agent, or Firm* — Keating & Bennett, LLP (57) ABSTRACT

A TFT 20 includes a gate electrode 21, a gate insulating film 22, a semiconductor layer 23, a source electrode 24, a drain electrode 25, etc. The semiconductor layer 23 is comprised of a metal oxide semiconductor (IGZO), and has a source portion 23a that contacts the source electrode 24, a drain electrode 23b that contacts the drain electrode 25, and a channel portion 23c that is located between the source and drain portions 23a, 23b. A reduced region 30 is formed at least in the channel portion 23c of the semiconductor layer 23, and the reduced region 30 has a higher content of a simple substance of a metal such as In than the remaining portion of the semiconductor layer 23.

4 Claims, 10 Drawing Sheets (56) References Cited

U.S. PATENT DOCUMENTS

2010/0181565 A1* 7/2010 Sakata et al. .................... 257/43
2010/0213459 A1* 8/2010 Shimada et al. ................ 257/43
2011/0042670 A1 2/2011 Sato et al.
2011/0069047 A1 3/2011 Koyama et al.
2012/0132911 A1 5/2012 Shimada et al.
2012/0223302 A1* 9/2012 Yukinobu et al. ............... 257/43

FOREIGN PATENT DOCUMENTS

WO    2009/136645 A2    11/2009
WO    WO 2011/055856  *  5/2011  ............. H01B 13/00

* cited by examiner

THIN FILM TRANSISTOR

TECHNICAL FIELD

The present invention relates to thin film transistors using a metal oxide semiconductor, and manufacturing methods thereof.

BACKGROUND ART

A thin film transistor using a metal oxide semiconductor containing In, Ga, and Zn is disclosed as one of this type of TFT (Patent Document 1).

Characteristics vary among a plurality of TFTs due to damage to a semiconductor layer which is caused when forming a protective layer over the semiconductor layer by a sputtering method etc. In the TFT of Patent Document 1, in order to decrease such a variation in characteristics, the semiconductor layer is formed by two layers having different physical properties. Specifically, a first layer is formed by a sputtering method, and then a second layer is formed thereon by a pulsed laser deposition method that forms a low density film. Thus, the semiconductor layer is oxidized to a depth greater than that to which the semiconductor layer is damaged when forming a protective film in an oxygen atmosphere. This increases the resistance in the damaged region so that electric characteristics of the semiconductor layer are not affected.

CITATION LIST

Patent Document

PATENT DOCUMENT 1: Japanese Patent Publication No. 2009-099944

SUMMARY OF THE INVENTION

Technical Problem

Metal oxide semiconductors typically have electron mobility of about 5 to 10 $cm^2/Vs$. As compared with amorphous silicon semiconductors (a-Si TFTs) and polysilicon semiconductors (p-Si TFTs) that are widely used in conventional examples, this electron mobility is higher than that of the a-Si TFTs (e.g., about 0.5 $cm^2/Vs$), but is lower by one or more orders of magnitude than that of the p-Si TFTs (e.g., about 100 $cm^2/Vs$ or more). Accordingly, an increase in electron mobility is essential for increasing the application range of metal oxide semiconductors.

However, in the TFT of Patent Document 1, the variation in electric characteristics among the TFTs can be suppressed, but instead, the resistance of the surface layer of the semiconductor layer is increased, and the thickness of the semiconductor layer is substantially decreased. Thus, the amount of current decreases upon application of a voltage between the electrodes (in the ON state). The TFT of Patent Document 1 is therefore disadvantageous in terms of increasing electron mobility.

It is an object of the present invention to provide a thin film transistor capable of increasing electron mobility and capable of ensuring satisfactory electric characteristics.

Solution to the Problem

In order to achieve the above object, a semiconductor layer is reformed by performing a reduction process on the semiconductor layer.

Specifically, a thin film transistor according to the present invention is provided on a substrate and includes: a gate electrode; a gate insulating film covered by the gate electrode; a semiconductor layer placed to face the gate electrode with the gate insulating film interposed therebetween; a source electrode connected to the semiconductor layer; and a drain electrode separated from the source electrode and connected to the semiconductor layer.

The semiconductor layer is comprised of a metal oxide semiconductor, and has a source portion that contacts the source electrode, a drain electrode that contacts the drain electrode, and a channel portion that is located between the source and drain portions. A reduced region is formed at least in the channel portion of the semiconductor layer, and the reduced region has a higher content of a simple substance of a metal than a remaining portion of the semiconductor layer.

That is, in this thin film transistor, the reduced region having a higher content of a simple substance of a metal, i.e., a non-oxidized pure metal, than the remaining portion of the semiconductor layer is formed at least in the channel portion of the semiconductor layer. This can increase electron mobility in the portion of the semiconductor layer where the reduced region is formed, as compared to the remaining portion of the semiconductor layer. Accordingly, the electron mobility of the semiconductor layer can be effectively increased.

More specifically, the metal oxide semiconductor is preferably an In—Ga—Zn—O metal oxide semiconductor including an oxide of at least one of In, Ga, and Zn.

With the In—Ga—Zn—O metal oxide semiconductor, satisfactory ON/OFF characteristics can be ensured by forming the reduced region therein.

The simple substance of the metal is preferably a simple substance of at least one of In and Ga, and in particular, a simple substance of In.

The reduced region may extend substantially in the entire channel portion. The term "substantially" herein refers to a concept including the case where the channel portion has a portion where the reduced region is not provided, if the reduced region can be functionally regarded as being provided in the entire channel portion.

Forming the reduced region in the entire channel portion can increase the electron mobility in the entire channel portion, and can further improve ON characteristics.

In this case, the reduced region preferably extends in the source portion and the drain portion continuously from the channel portion.

This can further decrease the resistance value of the source portion etc., and can improve electric characteristics between the source portion and the source electrode, etc.

In these cases, the content of the simple substance of In in the reduced region is preferably in a range of 0.5 to 50%.

This can ensure satisfactory electric characteristics.

The reduced region may be provided in the channel portion, and may be present substantially only in a surface region thereof located on an opposite side from the gate electrode in a thickness direction of the channel portion. The term "substantially" herein refers to a concept including the case where the surface region has a portion where the reduced region is not provided, and the case where the reduced region is provided in the surface region and in a portion other than the surface region, if the reduced region can be functionally regarded as being provided in the surface region.

This can improve ON characteristics while maintaining OFF characteristics, and can implement excellent ON/OFF characteristics.

In this case as well, as in the above case, the reduced region preferably extends in surface regions of the source portion and the drain portion continuously from the channel portion.

In these cases, the content of the simple substance of In in the reduced region is preferably in a range of 3 to 100%.

Providing the reduced region containing 3% or more of the simple substance of In can ensure satisfactory electric characteristics.

The content of the simple substance of In in the reduced region may be higher in the source portion and the drain portion than in the channel region.

This allows the electron mobility in the source portion etc. and the electron mobility in the channel portion etc. to be adjusted according to their functions, whereby the electric characteristics can further be improved.

In this case, the content of the simple substance of In in the reduced region is preferably in a range of 50 to 100% in the source portion and the drain portion.

Providing the reduced region containing 50% or more of the simple substance of In in the source portion and the drain portion can stably decrease the resistance value in the source portion etc., and can improve electric characteristics between the source portion and the source electrode, etc. Providing such a reduced region can also improve electric characteristics in the channel portion, and can ensure satisfactory ON characteristics.

These thin film transistors can be manufactured by a manufacturing method including a reduction step of reducing a predetermined region of the semiconductor layer after formation of the semiconductor layer.

For example, these thin film transistors can be manufactured by the method in which the reduction step includes a process of bringing a reducing substance, which is more likely to be oxidized than at least one of In and Ga, into contact with a surface of the predetermined region of the semiconductor layer, and then removing the reducing substance.

In particular, the reduction step preferably includes an annealing process of heating the semiconductor layer under a non-oxidizing atmosphere.

This can stabilize the simple substance of In etc., and can strengthen the reduced region.

Advantages of the Invention

As described above, according to the present invention, electron mobility of the semiconductor layer can be effectively increased. Thus, a thin film transistor having satisfactory electric characteristics can be implemented.

DESCRIPTION OF EMBODIMENTS

Embodiments of the present invention will be described in detail below with reference to the accompanying drawings. The following description is by way of illustration only, and is not intended to limit the present invention, its applications, or its uses.

First Embodiment

[Structure of TFT]

Figure 1:
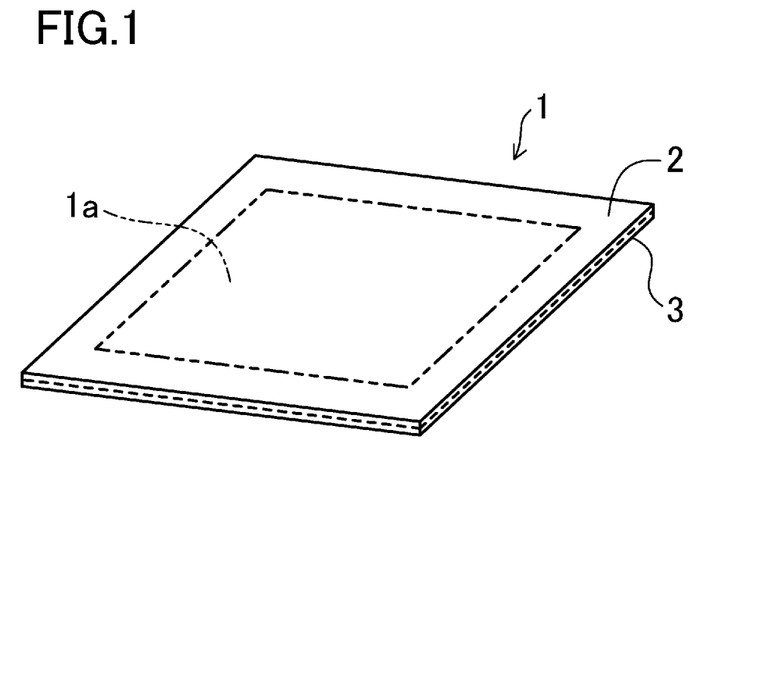
FIG. 1 is a schematic perspective view showing a panel of a liquid crystal display according to a first embodiment.

FIG. 1 shows a panel 1 of a liquid crystal display according to the present embodiment to which the present invention is applied. This liquid crystal display is an active matrix color display, and a plurality of pixels are arranged in a matrix pattern in a display region 1a of the panel 1.

The panel 1 is formed by bonding a pair of substrates 2, 3 together, and a liquid crystal layer is enclosed between the substrates 2, 3 (not shown). Red, green, and blue color filters are arranged in a predetermined pattern on one substrate 2 so as to correspond to the pixels (CF substrate), and a plurality of pixel electrodes 13, thin film transistors (TFTs 20), etc. are provided on the other substrate 3 so as to correspond to the pixels (TFT substrate).

Figure 2:
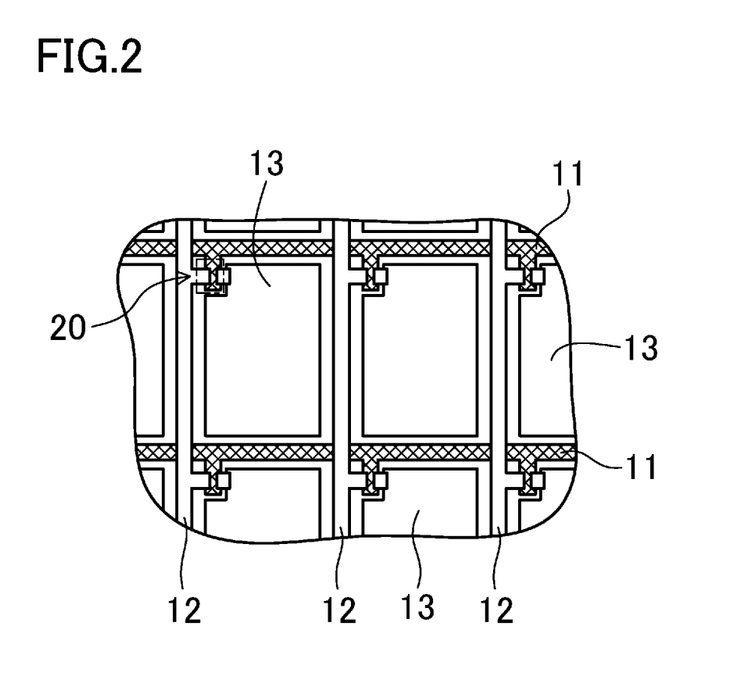
FIG. 2 is a schematic enlarged plan view of a main part in a display region of a TFT substrate.

FIG. 2 is an enlarged plan view of a main part of the display region 1a of the TFT substrate 3. In the figure, gate lines 11 (shaded regions) extend parallel in the lateral direction (row direction), and source lines 12 extend parallel in the vertical direction (column direction) perpendicularly to the gate lines 11. The pixel electrodes 13 are arranged in a grid pattern in a plurality of regions defined by the gate lines 11 and the source lines 12. In order to individually control the pixel electrode 13, the TFTs 20 are provided near the intersections of the gate lines 11 and the source lines 12 in these regions.

Figure 3:
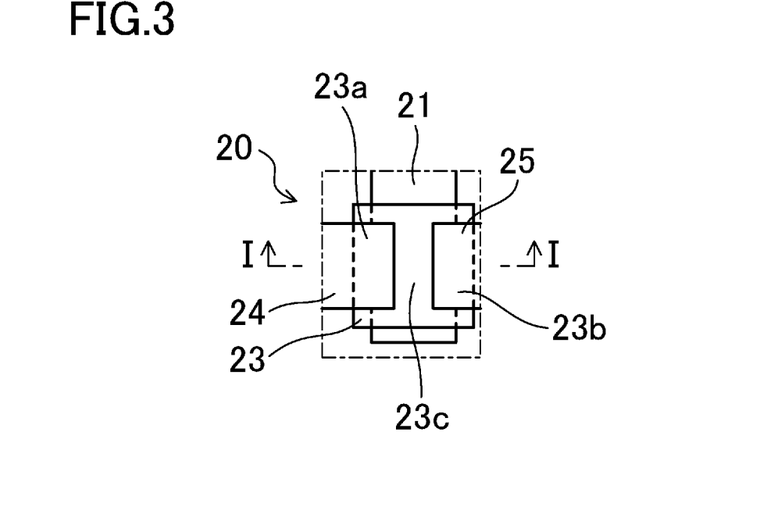
FIG. 3 is a schematic enlarged view of a region surrounded by a chain line in FIG. 2.
Figure 4:
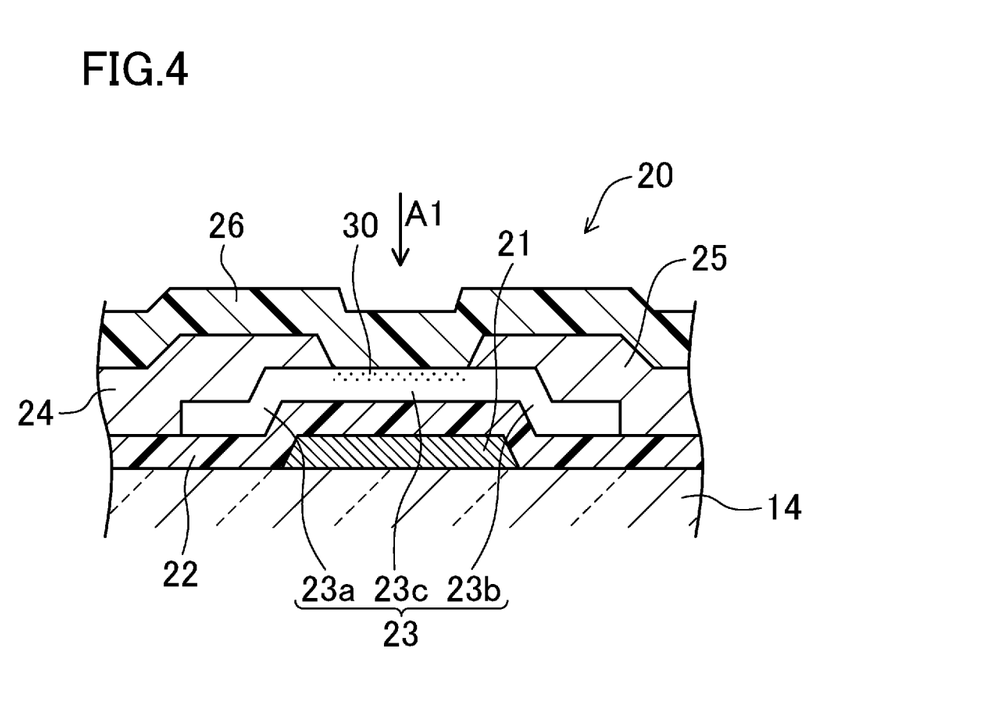
FIG. 4 is a schematic cross-sectional view taken along line I-I in FIG. 3.

FIGS. 3 and 4 show the TFT 20. The TFT 20 has an inverted staggered (bottom gate) structure, and has a stacked configuration on a substrate 14. The TFT 20 includes a gate electrode 21, a gate insulating film 22, a semiconductor layer 23, a source electrode 24, a drain electrode 25, a protective film 26, etc.

In the present embodiment, a highly insulating glass substrate is used as the substrate 14. The gate electrode 21 is patterned integrally with the gate line 11 on the substrate 14. For example, a simple substance of a metal such as Ti, Al, Pt, or Au or a metal compound such as an alloy containing the metal can be used as the gate electrode 21. A conductive oxide such as ITO may be used for the gate electrode 21. Any conductive material can be selected and used as appropriate as the material of the gate electrode 21.

The gate insulating film 22 is provided in order to insulate the gate electrode 21, and is stacked on the substrate 14 so as to cover the gate electrode 21. Any highly insulating material can be used as the material of the gate insulating film 22. For example, a silicon oxide film, a silicon nitride film, alumina ($Al_2O_3$), a stacked film thereof, etc. can be used as the gate insulating film 22. In the present embodiment, a stacked film of a silicon oxide film and a silicon nitride film ($SiO_2$/SiN) is used as the gate insulating film 22.

The semiconductor layer 23 is patterned on the gate insulating film 22, and is placed so as to face the gate electrode 21 with the gate insulating film 22 interposed therebetween. The thickness of the semiconductor layer 23 is about 50 nm. This semiconductor layer 23 is comprised of a metal oxide semiconductor. Specifically, an amorphous metal oxide semiconductor containing indium (In), gallium (Ga), and zinc (Zn) (In—Ga—Zn—O, also referred to as "IGZO") is used as the semiconductor layer 23. All of In, Ga, etc. contained in IGZO is substantially in the form of an oxide, but in the semiconductor layer 23 of the TFT 20, a region where In etc. has been reduced (a reduced region 30) is formed by performing a reduction process (described in detail below).

Like the gate electrode 21, a simple substance of a metal such as Ti, Al, Pt, or Au, a metal compound such as an alloy containing the metal, or a conductive oxide such as ITO can be used as the material of the source electrode 24 and the drain electrode 25. In the present embodiment, however, a material having low reduction capability (a low reduction material), namely a material that is more likely to be oxidized than In or Ga and is less likely to reduce In and Ga, is used as the material of the source electrode 24 and the drain electrode 25. Such a material may be placed only in a region that directly contacts the semiconductor layer 23. This suppresses formation of the reduced region 30 in the semiconductor layer 23 due to an action of the source electrode 24 etc.

Each of the source electrode 24 and the drain electrode 25 is patterned so as to contact the upper surface of the semiconductor layer 23. Specifically, the source electrode 24 has its one end integrally connected to the source line 12 and the other end extending on the upper surface of the semiconductor layer 23 and integrally connected to the semiconductor layer 23. The drain electrode 25 has its one end integrally connected to the pixel electrode 13 and the other end extending on the upper surface of the semiconductor layer 23 from the opposite side of the semiconductor layer 23 from the source electrode 24 and integrally connected to the semiconductor layer 23. The tip end of the end of the source electrode 24 which is connected to the semiconductor layer 23 faces the tip end of the end of the drain electrode 25 which is connected to the semiconductor layer 23, at a predetermined distance therebetween.

Thus, the semiconductor layer 23 has a portion that contacts the source electrode 24 (a source portion 23a), a portion that contacts the drain electrode 25 (a drain portion 23b), and a portion that is located between the tip ends of the source portion 23a and the drain portion 23b and that does not contact the source electrode 24 and the drain electrode 25 (a channel portion 23c).

The protective film 26 is stacked on the source electrode 24, the drain electrode 25, and the channel portion 23c of the semiconductor layer 23 so as to cover the source electrode 24, the drain electrode 25, and the channel portion 23c of the semiconductor layer 23. Like the gate insulating film 22, a highly insulating material is used as the protective film 26. In this TFT 20, a silicon oxide film ($SiO_2$) is used as the protective film 26.

(Reduced Region)

In this TFT 20, the reduced region 30 is formed in which oxides of In and Ga have been reduced by a reduction process and the contents of simple substances of In and Ga as pure metals are significantly higher than their original contents in IGZO. The reduced region 30 does not have to be a region having a distinct boundary with other regions, and the present invention includes the case where the reduced region 30 does not have a distinct boundary with other regions and the contents of the simple substances of In and Ga gradually increase from other region.

In the TFT 20 of the present embodiment, the reduced region 30 is provided in a surface region of the semiconductor layer 23 which is located on the side of the upper surface of the channel portion 23c (the opposite side from the side facing the gate electrode 21, the back-channel side) (shown by the dotted region in FIG. 4). Specifically, the reduced region 30 is formed at least in a portion (an interface portion) of the semiconductor layer 23 which is exposed between the source electrode 24 and the drain electrode 25 and which contacts the protective film 26, so that the reduced region 30 extends by several tens of nanometers in the thickness direction from the surface of the semiconductor layer 23. In this reduced region 30, oxides of In, Ga, etc. contained in the semiconductor layer 23 have been reduced into simple substances of In, Ga, etc. The contents of the components in the channel portion 23c of the TFT 20 of the present embodiment will be described in detail by comparing with a conventional TFT.

Figure 5:
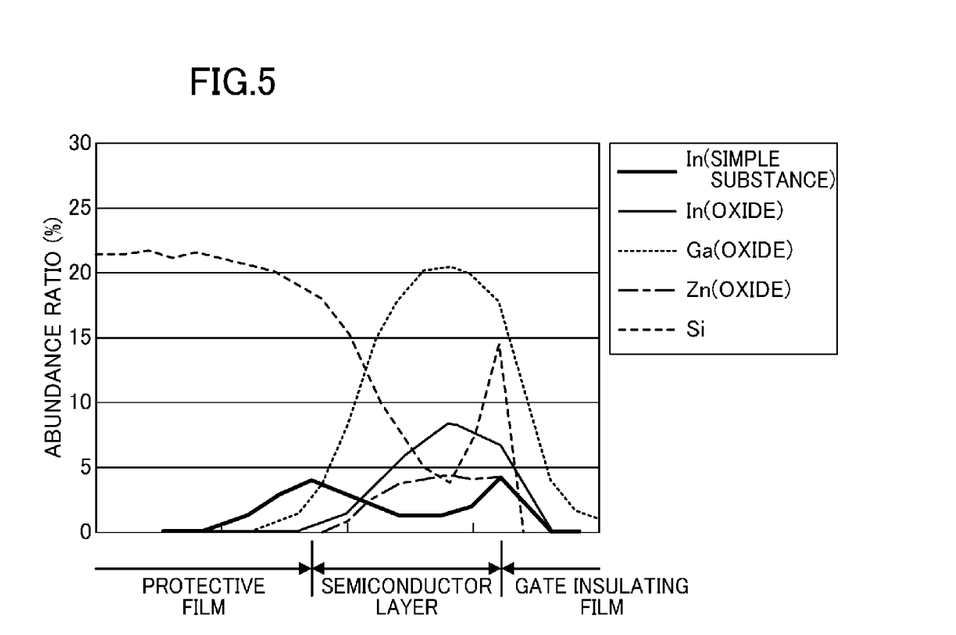
FIG. 5 is a diagram showing the abundance ratios of primary components in different regions of a TFT of the first embodiment.
Figure 6:
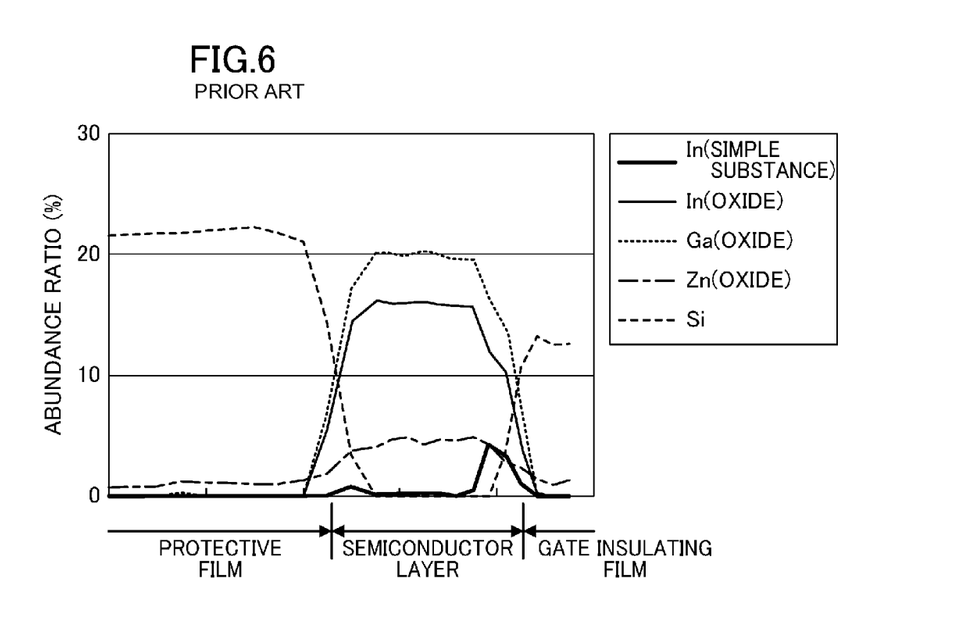
FIG. 6 is a diagram showing the abundance ratios of primary components in different regions of a conventional TFT.

FIGS. 5 and 6 are diagrams showing the abundance ratios (percentages) of the primary components in the channel portion 23c of each TFT. FIG. 5 shows the TFT 20 of the present embodiment having the reduced region 30, and FIG. 6 shows a conventional TFT having no reduced region 30. FIGS. 5 and 6 show the results in the portion shown by arrow A1 in FIG. 4, which were obtained by using Auger electron spectroscopy (AES).

As shown in FIG. 6, in the conventional TFT, In is mostly in the form of an oxide, and is hardly contained in the form of a simple substance. In particular, a simple substance of In is present in a surface region that is located on the side of the substrate 14 and that contacts the gate insulating film 22, but is not present on the back-channel side that contacts the protective film 26.

On the other hand, as shown in FIG. 5, in the TFT 20 of the present embodiment, the content of the simple substance of In is increased, and the abundance ratio of the simple substance of In is relatively high on the back-channel side of the TFT 20, namely in the reduced region 30. In the present embodiment, the content of the simple substance of In (the percentage of the simple substance of In to the total amount of In (simple substance of In+In oxide) in a surface region of the channel portion 23c (the range extending by 5-25 nm in the thickness direction from the surface) is adjusted to the range of 3 to 100%.

Since the proportion of the reduced region 30 to the entire semiconductor layer 23 is small, electron mobility may not be effectively increased unless the surface region of the channel portion 23c contains at least 3% of the simple substance of In.

Satisfactory ON characteristics can be stably ensured if the surface region of the channel portion 23c contains 3% or more of the simple substance of In.

Figure 7:
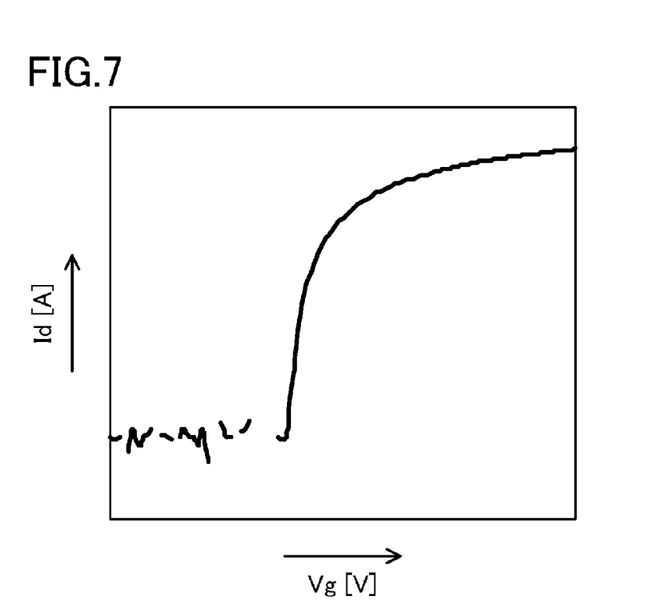
FIG. 7 is a graph showing transistor characteristics of the TFT of the first embodiment.

FIG. 7 schematically shows transistor characteristics (Vg-Id characteristics) of the TFT 20 of the present embodiment. As can be seen from the graph of FIG. 7, satisfactory ON/OFF characteristics are implemented in the TFT 20 of the present embodiment. In particular, in the ON state, electron mobility of 10-20 cm$^2$/Vs is achieved because the reduced region 30 is formed in a region of the channel portion 23c which is located on the back-channel side. The electron mobility in the ON state is thus significantly improved over the conventional TFT (about 5-10 cm$^2$/Vs). Since a region of the channel portion 23c which is located on the side of the gate electrode 21 has no reduced region 30 and has a configuration similar to that of the conventional TFT 20, OFF characteristics in the conventional TFT 20 are maintained in the TFT 20 of the present embodiment.

Thus, according to the TFT 20 of the present embodiment, ON characteristics can be improved while maintaining OFF characteristics of the conventional IGZO, and thus excellent ON/OFF characteristics can be implemented. Since the entire semiconductor layer 23 can be effectively used, an increase in the amount of current can be expected as compared to the conventional TFT. Since the electron mobility in the ON state is increased, the application range of the TFT 20 of the present embodiment is increased. Thus, the TFT 20 of the present embodiment can be used in various applications, and is advantageous in terms of usefulness.

(Manufacturing Method of TFT)

Figure 8:
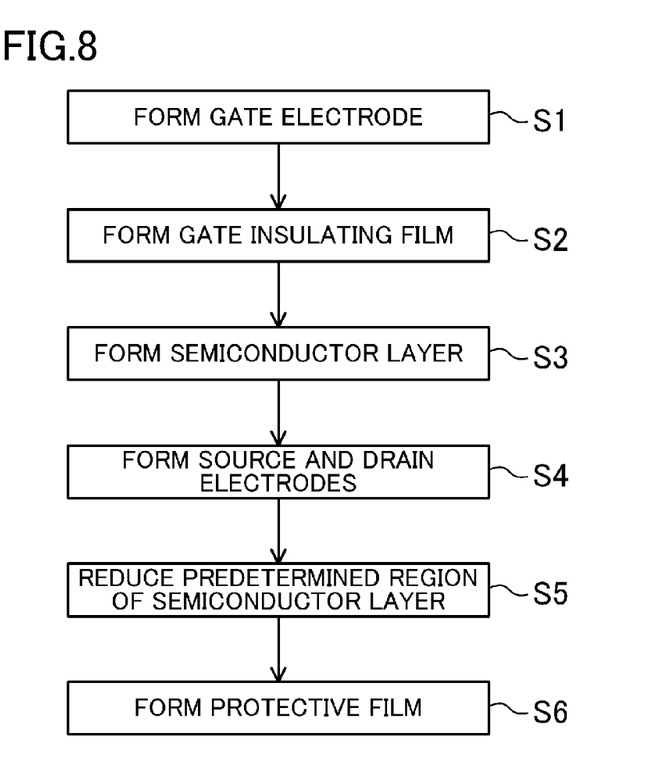
FIG. 8 is a flowchart illustrating a manufacturing method of the TFT of the first embodiment.

A manufacturing method of the TFT 20 of the present embodiment will be described below with reference to FIG. 8. As shown in the figure, the manufacturing process includes a gate electrode formation step of forming the gate electrode 21 (step S1), a gate insulating film formation step of forming the gate insulating film 22 (step S2), a semiconductor layer formation step of forming the semiconductor layer 23 (step S3), a source/drain electrode formation step of forming the source electrode 24 and the drain electrode 25 (step S4), a reduction step of reducing a predetermined region of the semiconductor layer 23 (step S5), and a protective film formation step of forming the protective film 26 (step S6).

(Gate Electrode Formation Step)

A conductive metal film is formed with a predetermined thickness on the entire upper surface of the substrate 14 by a sputtering method. Then, the entire metal film is coated with a photosensitive resin film by a spin coating method. Thereafter, the photosensitive resin film is patterned by using a photomask to form a predetermined resist pattern. A part of the metal film which is exposed from the resist pattern is removed by wet etching. Subsequently, the resist pattern, which is no longer required, is delaminated. In this manner, the gate electrode 21 and the gate line 11 can be formed in a predetermined pattern on the substrate 14.

(Gate Insulating Film Formation Step)

A stacked film of a silicon nitride film and a silicon oxide film is formed by a plasma chemical vapor deposition (CVD) method on the entire upper surface of the substrate 14 having the gate electrode 21 etc. Then, the entire stacked film is coated with a photosensitive resin film by a spin coating method. Thereafter, the photosensitive resin film is patterned by using a photomask to form a predetermined resist pattern. A part of the stacked film which is exposed from the resist pattern is removed by dry etching. Subsequently, the resist pattern, which is no longer required, is delaminated, whereby the gate insulating film 22 is formed in a predetermined pattern.

(Semiconductor Layer Formation Step)

The semiconductor layer 23 having a predetermined pattern is formed by using a patterning process similar to that of the gate electrode formation step. Specifically, a metal oxide semiconductor film comprised of IGZO is formed with a predetermined thickness on the entire upper surface of the substrate 14 having the gate insulating film 22 by a sputtering method. The present invention is not limited to the sputtering method, and a coating method may be used. Then, the entire metal oxide semiconductor film is coated with a photosensitive resin film by a spin coating method. Thereafter, the photosensitive resin film is patterned by using a photomask to form a predetermined resist pattern. A part of the metal oxide semiconductor film which is exposed from the resist pattern is removed by wet etching. Subsequently, the resist pattern, which is no longer required, is delaminated, whereby the semiconductor layer 23 is formed in a predetermined pattern.

(Source/Drain Electrode Formation Step)

In this step, the source electrode 24, the drain electrode 25, and the source line 12 are patterned at a time on the substrate 14 having the semiconductor layer 23, by using a patterning process similar to that in the gate electrode formation step etc.

(Reduction Step)

In this step, the reduced region 30 is formed in the semiconductor layer 23. In the present embodiment, a process of exposing the upper surface of the substrate 14 having the source electrode 24 etc. to hydrogen plasma is performed. In this process, the source and drain portions 23a, 23b of the semiconductor layer 23 are not reduced by the hydrogen plasma because they are covered by the source electrode 24 and the drain electrode 25. However, the surface of the channel region 23c is exposed, and thus can be selectively reduced by the hydrogen plasma. The reduced region 30 can be formed only in the surface region of the channel portion 23c of the semiconductor layer 23 by adjusting the intensity of the hydrogen plasma and the exposure time thereto. The condition of the reduced region 30 can be adjusted in this manner.

A reducing substance that is more likely to be oxidized than In or Ga may be brought into contact with the surface of the channel portion 23c and then removed to reduce only the surface region of the channel portion 23c. For example, by a sputtering method or a plasma CVD method, a reducing substance such as Ti, Mo, or TiN may be formed on the entire upper surface of the substrate 14 having the source electrode 24 etc., thereby forming a reducing film. After the resultant substrate is left for a predetermined time, an etching process is performed to remove the reducing film.

Thus, the reducing substance can be stably in contact with the surface of the channel portion 23c, and only the surface region can be easily reduced. The degree of reduction in the reduced region 30, the range in which the reduced region 30 is to be formed (depth), etc. can be changed by adjusting the type of reducing substance, the film thickness thereof, the contact time, the temperature, etc. A series of processes of bringing the reducing substance into contact with the surface and removing the reducing substance may be repeated a plurality of times.

A nonmetal material containing hydrogen may be used as the reducing substance. For example, a silicon nitride film containing hydrogen is formed by a plasma CVD method on the upper surface of the substrate 14 having the source electrode 24 etc., thereby forming a reducing film. After the resultant substrate is left for a predetermined time, a wet etching process is performed to remove the reducing film. This method is more advantageous in terms of productivity because the reducing film can be easily removed.

It is also preferable to perform an annealing process after forming the reduced region 30 in the semiconductor layer 23. For example, after the reduced region 30 is formed, the substrate 14 is heated under a non-oxidizing atmosphere that causes no oxidation reaction, such as under an inert gas atmosphere such as Ar, under vacuum conditions, etc., and is held at 300-400° C. for a predetermined time. This can stabilize simple substances of In and Ga, and can strengthen the reduced region 30.

(Protective Film Formation Step)

In this step, in order to protect the semiconductor layer 23, the source electrode 24, and the drain electrode 25, the insulating protective film 26 is formed so as to cover the surfaces of the semiconductor layer 23, the source electrode 24, and the drain electrode 25. For example, after the reduction step, the insulating protective film 26 such as a silicon nitride film or a silicon oxide film may be formed with a predetermined thickness on the entire upper surface of the substrate 14 by a sputtering method or a plasma CVD method.

[Modification]

Figure 9:
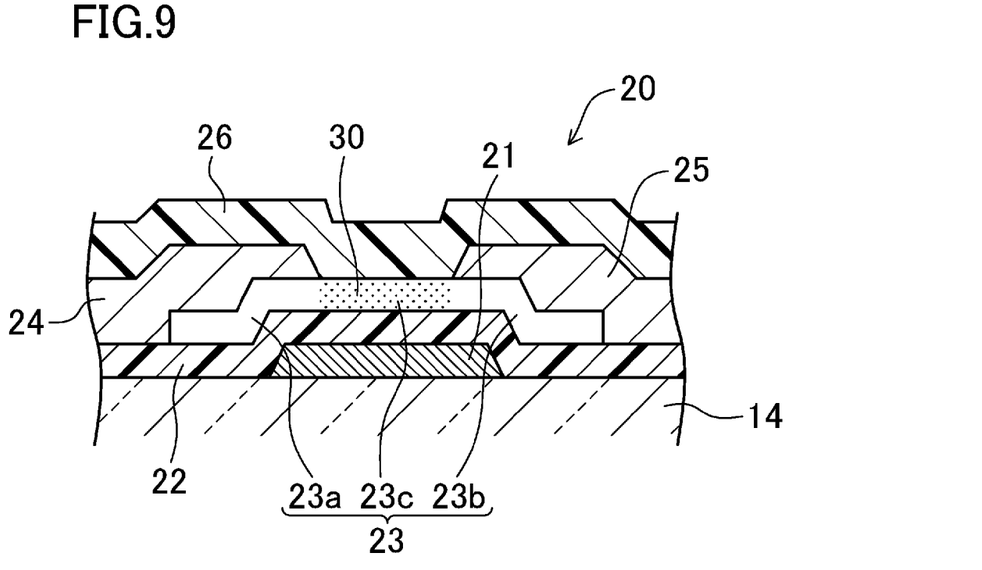
FIG. 9 is a diagram corresponding to FIG. 4, showing a modification of the first embodiment.

FIG. 9 shows a modification of the present embodiment. In this modification, the reduced region 30 extends substantially in the entire channel portion 23c. Since other configurations are the same as those of the above embodiment, only the different configuration will be described below, and like members etc. will be denoted by like reference characters and description thereof will be omitted (the same applies to the following embodiments and modifications).

In the TFT 20 of this modification, the reduced region 30 is formed only in the channel portion 23c of the semiconductor layer 23 so as to extend in the entire channel region 23c rather than only in the surface region of the channel portion 23c. Thus forming the reduced region 30 extending in the entire channel portion 23c can more stably increase the electron mobility in the ON state. The content of the simple substance of In etc. need not necessarily be uniform in the entire channel portion 23c. For example, the content of the simple substance of In etc. in the channel region 23c may be high at the surface of the channel region 23c, and may gradually decrease as the distance from the surface increases.

In this case, the content of the simple substance of In in the reduced region 30, namely in the entire channel portion 23c, is preferably adjusted to the range of 0.5 to 50%. This can ensure balanced satisfactory ON/OFF characteristics. That is, the reduced region 30 containing less than 0.5% of the simple substance of In may not ensure an effective increase in electron mobility depending on the variation, and the reduced region 30 containing more than 50% of the simple substance of In may excessively decrease the resistance value and may destabilize the ON/OFF characteristics.

Second Embodiment

Figure 10:
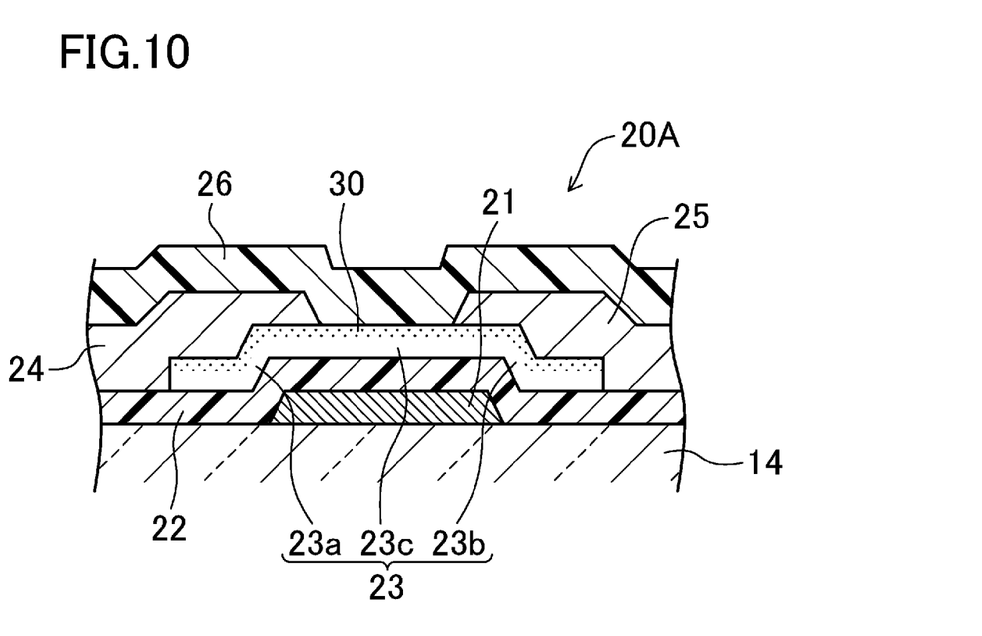
FIG. 10 is a schematic cross-sectional view showing a TFT of a second embodiment.

FIG. 10 shows a TFT 20A of the present embodiment. In the TFT 20A of the present embodiment, the reduced region 30 extends not only in the surface region of the channel portion 23c and but also in the surface regions of the source portion 23a and the drain portion 23c continuously from the surface region of the channel portion 23c. That is, the reduced region 30 extends in the entire surface region of the semiconductor layer 23. The reduced region 30 need not necessarily extend to the terminal ends of the source portion 23a and the drain portion 23b. For example, the reduced region 30 may not be formed in a region of the semiconductor layer 23 which is located away from the channel portion 23c.

According to this TFT 20A, the reduced region 30 is formed in the regions of the source portion 23a etc. which directly contact the source electrode 24 and the drain electrode 25. This can decrease the resistance value in the contact regions, and can further improve electric characteristics. Since the reduced region 30 in the source portion 23a etc. is continuous with the reduced region 30 in the channel portion 23c, excellent ON/OFF characteristics can be ensured in addition to improvement in electric characteristics.

A manufacturing method of the TFT 20A of the present embodiment can be easily implemented by, e.g., using, in the manufacturing method of the first embodiment, a reducing substance that is more likely to be oxidized than In etc. as the material of the source electrode 24 and the drain electrode 25. Specifically, for example, Ti may be used as the material of the source electrode 24 and the drain electrode 25. In this case, In etc. in the surface regions of the semiconductor layer 23 which contact the source electrode 24 and the drain electrode 24 can be reduced by the reduction action of Ti, whereby the reduced region 30 can be formed in the surface regions of the source portion 23a and the drain portion 23b of the semiconductor layer 23.

A process similar to the reduction step of the first embodiment is performed to form the reduced region 30 in the surface region of the channel portion 23c. Thus, the reduced region 30 can be easily formed so as to extend in the entire surface region of the semiconductor layer 23.

Figure 11:
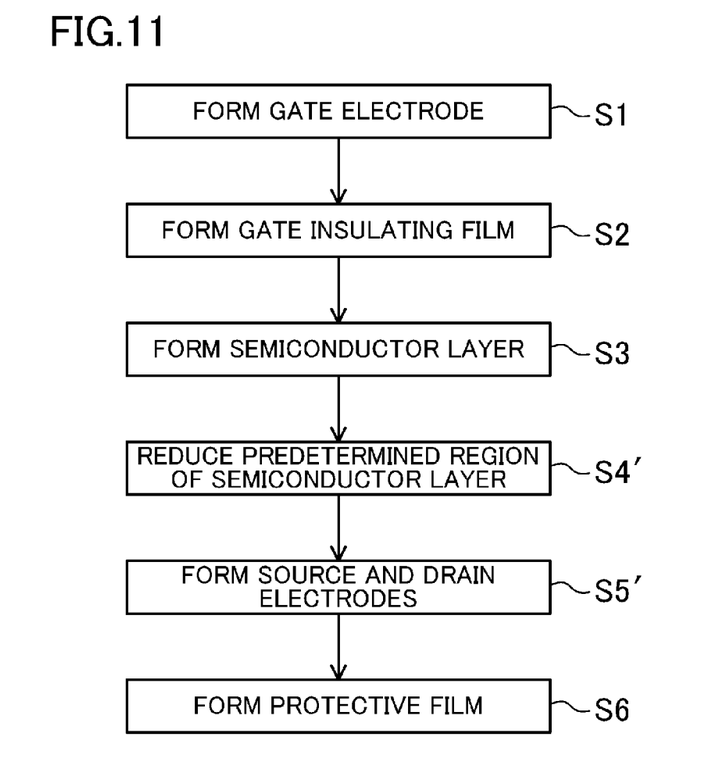
FIG. 11 is a flowchart illustrating an example of a manufacturing method of the TFT of the second embodiment.

For example, as shown in FIG. 11, the configuration of the second embodiment may be implemented by switching the source/drain electrode formation step and the reducing step in the above manufacturing method (steps S4', S5'), namely by performing the reduction step between formation of the semiconductor layer 23 and formation of the source electrode 24 and the drain electrode 25. According to this method, the reduced region 30 can be formed in the source portion 23a etc. regardless of whether the source electrode 24 and the drain electrode 25 have the capability to reduce In etc. or not.

For example, if a process of exposing the upper surface of the substrate 14 having the semiconductor layer 23 to hydrogen plasma is performed, the entire surface region of the semiconductor layer 23 can be reduced, because the entire surface region of the semiconductor layer 23 is exposed. Thus, the reduced region 30 can be formed in the entire surface region of the semiconductor layer 23. Similarly, the reduced region 30 can be formed in the entire surface region of the semiconductor layer 23 by the above method of forming and removing the reducing film.

[First Modification]

Figure 12:
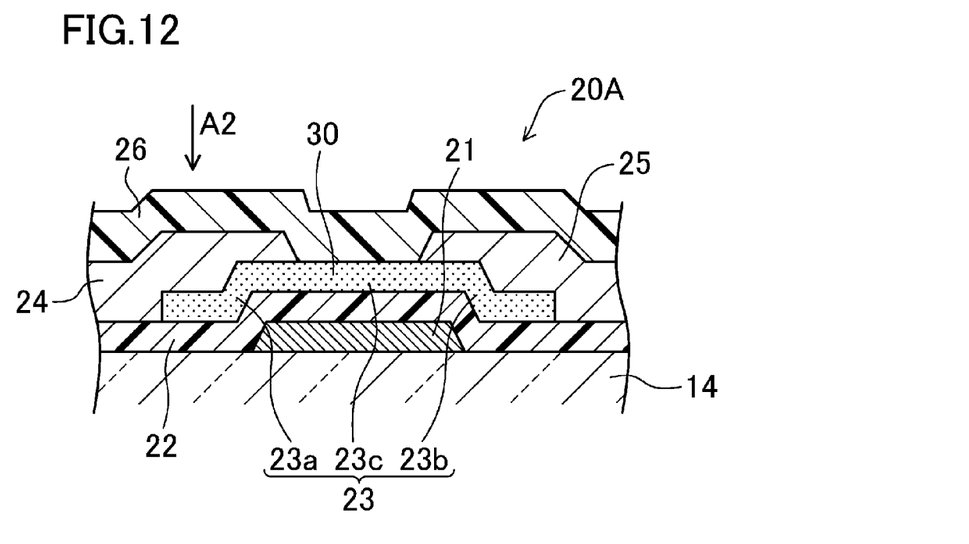
FIG. 12 is a schematic cross-sectional view showing a first modification of the second embodiment.

FIG. 12 shows a modification of the present embodiment. The TFT 20A of the present modification is different from the TFT 20A of the second embodiment in that the reduced region 30 extends substantially in the entire semiconductor layer 23 rather than only in the surface region of the semiconductor layer 23.

Figure 13:
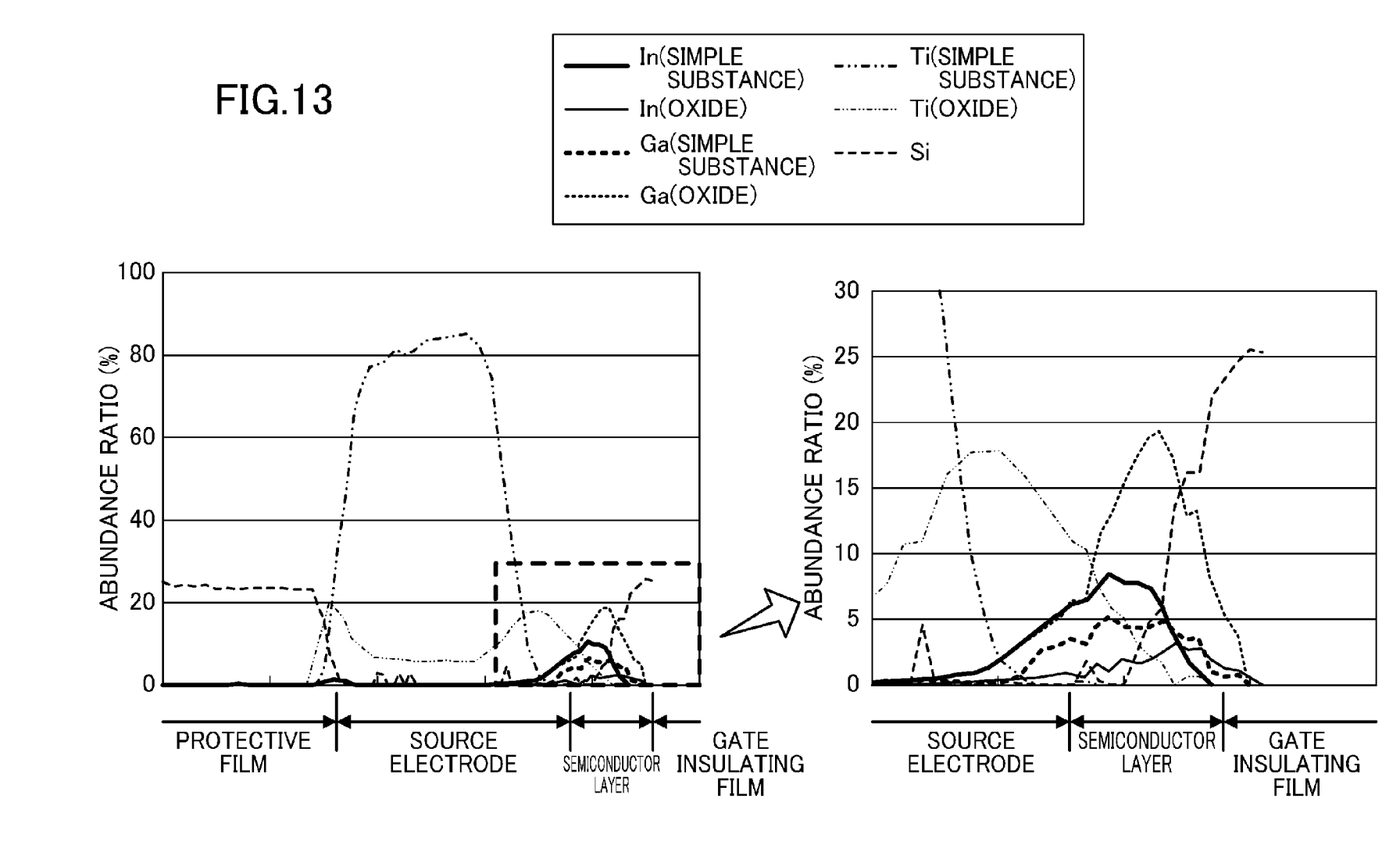
FIG. 13 is a diagram showing the abundance ratios of primary components in different regions of the TFT of the second embodiment.

FIG. 13 is a diagram showing the abundance ratios of the primary components in the source portion 23a shown by arrow A2 in FIG. 12. As shown in the enlarged view in the figure, the abundance ratio of the simple substance of In is much higher than that of an In oxide substantially in the entire source portion 23a of the semiconductor layer 23, and the content of the simple substance of In is significantly high (the content of the simple substance of In is higher than 80%) substantially in the entire source portion 23a of the semiconductor layer 23. Although not as much as In, a simple substance of Ga is present substantially in the entire source portion 23a of the semiconductor layer 23.

Thus, forming the reduced region 30 extending in the entire semiconductor layer 23 can more stably increase the electron mobility in the ON state. The content of the simple substance of In etc. need not necessarily be uniform in the entire semiconductor layer 23. For example, the content of the simple substance of In etc. in the semiconductor layer 23 may be high at the surface of the semiconductor layer 23, and may gradually decrease as the distance from the surface increases. Alternatively, the content of the simple substance of In etc. may be high in the channel portion 23c, and may gradually decrease as the distance from the channel portion 23c increases.

In this case, the content of the simple substance of In in the reduced region 30, namely in the entire semiconductor layer 23, is preferably adjusted to the range of 0.5 to 50%. The reduced region 30 containing less than 0.5% of the simple substance of In may not ensure an effective increase in electron mobility, and the reduced region 30 containing more than 50% of the simple substance of In may destabilize the ON/OFF characteristics. On the other hand, the reduced region 30 containing 0.5 to 50% of the simple substance of In can ensure balanced satisfactory ON/OFF characteristics.

[Second Modification]

Figure 14:
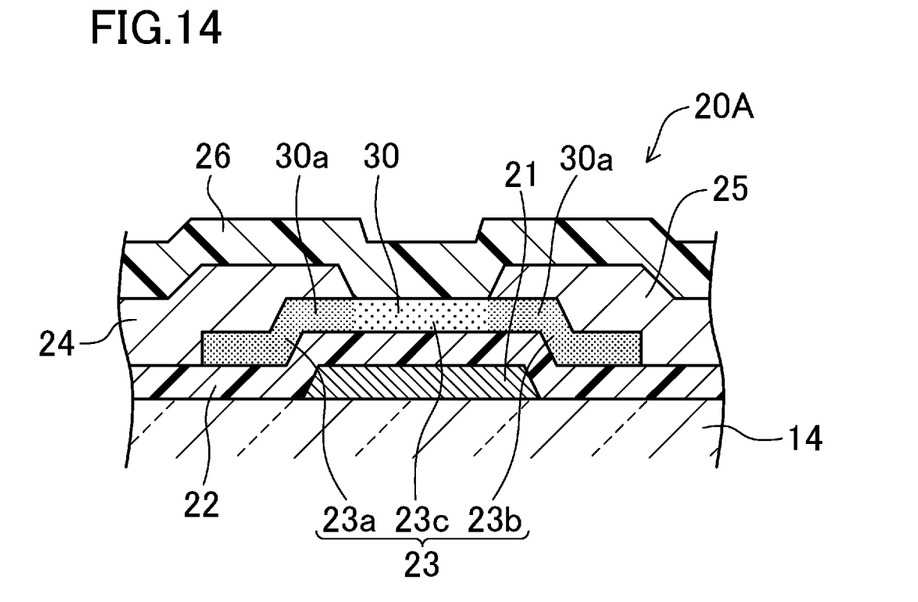
FIG. 14 is a schematic cross-sectional view showing a second modification of the second embodiment.

FIG. 14 shows a TFT 20A of this modification. The TFT 20A of this modification is different from the TFT 20A of the first modification in that the content of the simple substance of In etc. in the reduced region 30 is higher in the source portion 23a and the drain portion 23c than in the channel portion 23c (highly reduced regions 30a). In this case, there need not necessarily be a distinct boundary of the content between the channel portion 23c and the source portion 23a etc., and the present invention includes the case where there is no distinct boundary of the content between the channel portion 23c and the source portion 23a etc., and the content of the simple substance of In etc. gradually changes in the boundary region between the channel portion 23c and the source portion 23a etc.

In this case, the content of the simple substance of In in the source portion 23a and the drain portion 23b of the reduced region 30 is preferably adjusted to the range of 50 to 100%. Forming the source and drain portions 23a, 23b containing 50% or more of the simple substance of In can stably decrease the resistance value of the source portion 23a etc., and can improve electric characteristics between the source portion 23a and the source electrode 24, etc. This also can improve the electric characteristics in the channel portion 23c, and can ensure satisfactory ON/OFF characteristics.

For example, in a manufacturing method of the TFT 20A of the present embodiment, a reduction process may be performed between formation of the semiconductor layer 23 and formation of the source electrode 24 and the drain electrode 25 (see FIG. 11). For example, only the source portion 23a etc. can be reduced by covering the surface of the channel portion 23c with a resist film by using photolithography, and exposing the substrate to hydrogen plasma. The degree of reduction can be varied between the source portion 23a etc. and the channel portion 23c by exposing the substrate again to hydrogen plasma after removing the resist film, or by performing another reduction process after forming the source electrode 24 etc.

[Third Modification]

Figure 15:
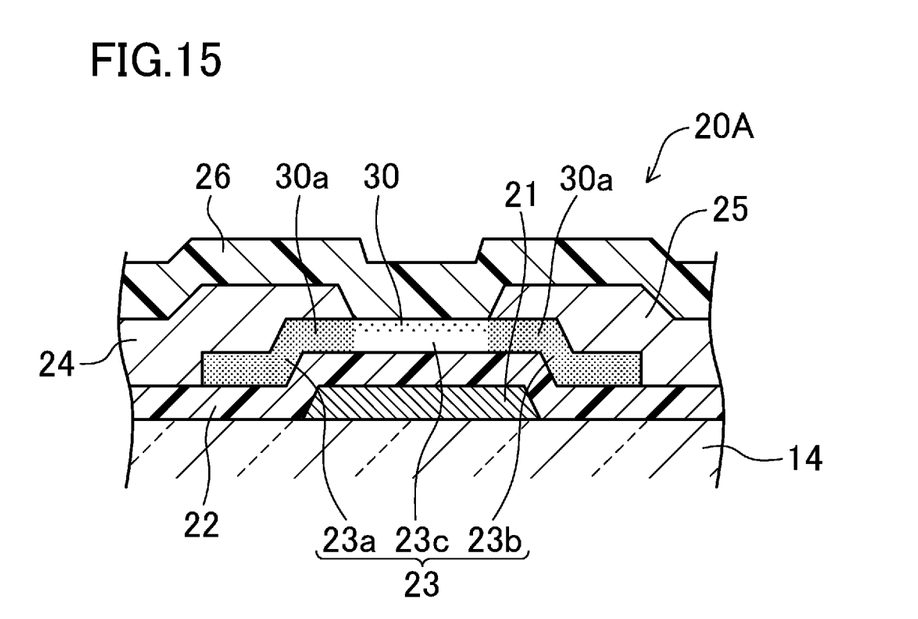
FIG. 15 is a schematic cross-sectional view showing a third modification of the second embodiment.

FIG. 15 shows a TFT 20A of this modification. The TFT 20A of this modification is different from the TFT 20A of the second modification in that the reduced region 30 of the channel portion 23c is formed only in the surface region thereof. According to the TFT 20A of this modification, the reduced region 30 of the channel portion 23c is present only on the back-channel side, ON characteristics can be improved while maintaining the OFF characteristics of the conventional example. Thus, satisfactory ON/OFF characteristics can be ensured. Since the resistance value can be stably decreased in the source portion 23a etc., electric characteristics between the source portion 23a and the source electrode 24, etc. can be improved, and more satisfactory ON characteristics can be ensured.

Other Embodiments

The above embodiments and the modifications thereof may be applied to TFTs 20 having the following configurations.

Figure 16:
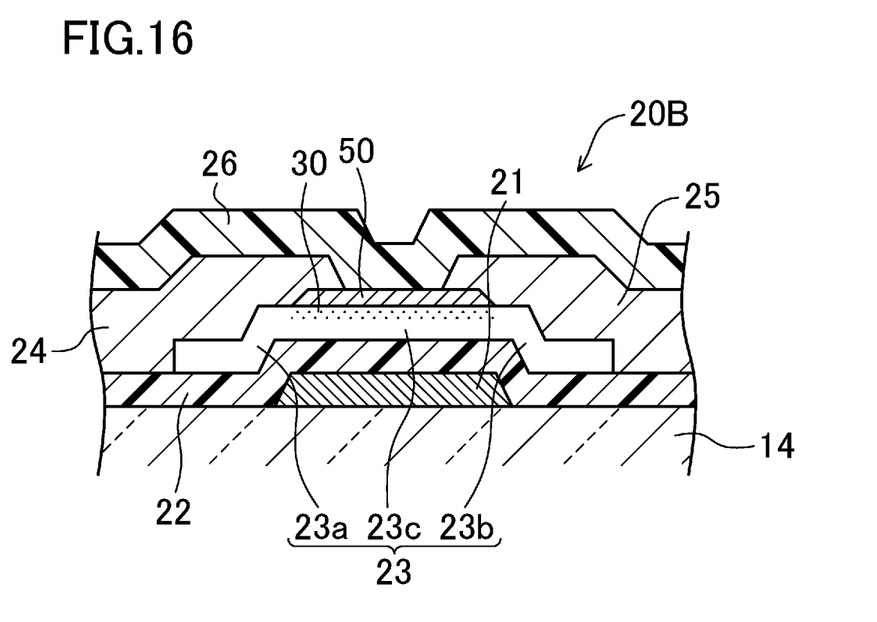
FIG. 16 is a schematic cross-sectional view showing an example in which the present invention is applied to another TFT.

FIG. 16 shows an example in which the present invention is applied to a TFT 20B with an inverted staggered (bottom gate) structure having an etch stopper 50. This TFT 20B is different from the above embodiments etc. in that the etch stopper 50 is provided on the upper surface of the channel portion 23c so as to cover the channel portion 23c.

In the figure, the reduced region 30 is formed only in the surface region of the channel portion 23c. However, as in the above embodiments etc., the reduced region 30 may extend in the entire channel region 23c, or may extend in the source portion 23a etc. (the same applies to the following description). In particular, in the case where the reduced region 30 in the channel portion 23c is formed only in the surface region thereof, the reduced region 30 can be protected by the etch stopper 50. Accordingly, this configuration is advantageous in that the reduced region 30 can stably perform its function.

Figure 17:
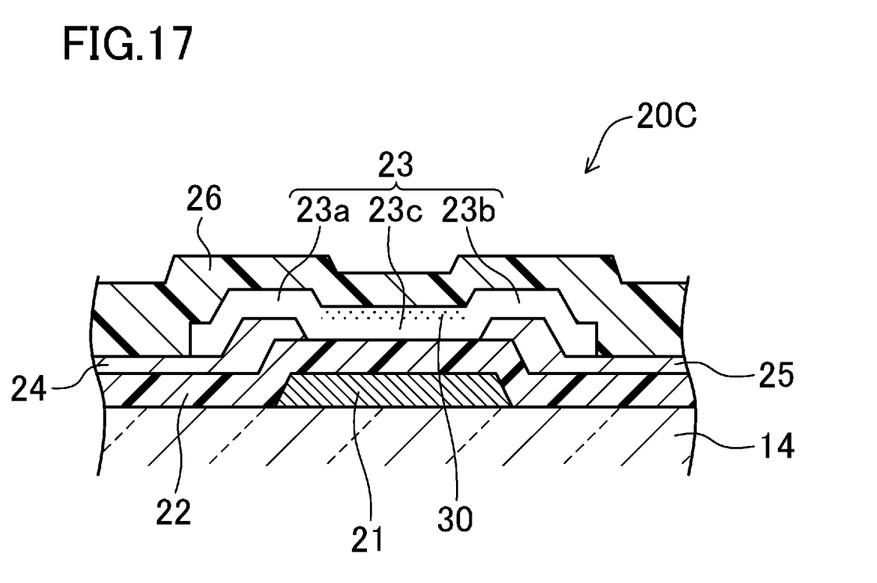
FIG. 17 is a schematic cross-sectional view showing an example in which the present invention is applied to still another TFT.

FIG. 17 shows an example in which the present embodiment is applied to a TFT 20C in which the source electrode 24 etc. and the semiconductor layer 23 are reversed in position from the above embodiments etc. Specifically, in this TFT 20C, the source electrode 24 and the drain electrode 25 are patterned on the gate insulating film 22, and the semiconductor layer 23 is patterned thereon so as to be stacked thereon. Accordingly, in this case, the contact regions of the semiconductor layer 23 with the source electrode 24 etc. are located on the lower side of the semiconductor layer 23 (on the side of the substrate 14).

Figure 18:
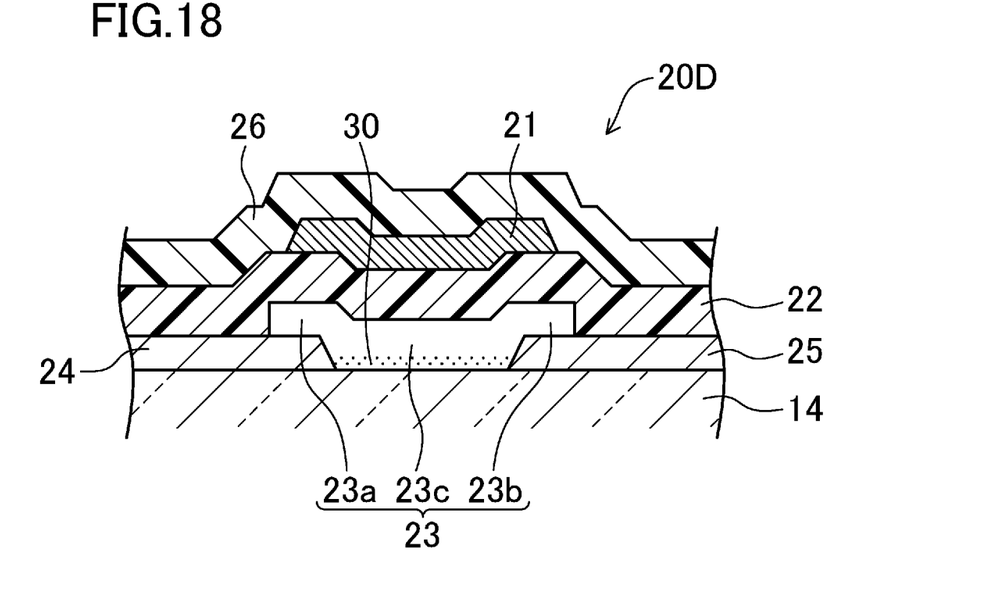
FIG. 18 is a schematic cross-sectional view showing an example in which the present invention is applied to yet another TFT.

FIG. 18 shows an example in which the present invention is applied to a TFT 20D with a staggered (top gate) structure. In this TFT 20D, the source electrode 24 and the drain electrode 25 are patterned on the substrate 14. The semiconductor layer 23 is patterned thereon so as to cover the tip end of the source electrode 24, the tip end of the drain electrode 25, and a portion of the substrate 14 which is exposed between the source electrode 24 and the drain electrode 25. In this case, a portion of the semiconductor layer 24 which contacts the substrate 14 corresponds to the channel portion 23c.

The gate insulating film 22 is formed on the semiconductor layer 23 etc., and the gate electrode 21 is patterned on the gate insulating film 22 so as to face the semiconductor layer 23 with the gate insulating film 22 interposed therebetween. The protective film 26 is formed on the gate electrode 21 etc. so as to cover the gate electrode 21 etc.

In the TFT 20D, the reduced region 30 is preferably formed at least in a surface region of the channel portion 23c which is located on the side of the substrate 14. This can ensure satisfactory ON/OFF characteristics as in the above embodiments etc.

The thin film transistor etc. of the present invention is not limited to the above embodiments etc., and includes various other configurations.

For example, although the above embodiments etc. show a liquid crystal display, the present invention may be applied to organic electroluminescence (EL) displays. The substrate 14 is not limited to a glass substrate. The substrate 14 may be a resin substrate such as polyethylene terephthalate (PET), or a metal substrate covered with an insulating layer. The metal oxide semiconductor is not limited to IGZO, and may be ISiZO, IAlZO, etc.

INDUSTRIAL APPLICABILITY

The thin film transistor etc. of the present invention can be used in displays of personal computers (PCs) and televisions (TVs), camcorders, digital cameras, navigation systems, audio playback apparatuses (such as car audio systems and stereo systems), game machines, mobile information terminals (such as mobile computers, mobile phones, mobile game machines, and electronic books), etc.

DESCRIPTION OF REFERENCE CHARACTERS

1 Panel
3 TFT Substrate
11 Gate Line
12 Source Line
13 Pixel Electrode
14 Substrate
20 Thin Film Transistor (TFT)
21 Gate Electrode
22 Gate Insulating Film
23 Semiconductor Layer
23a Source Portion
23b Drain Portion
23c Channel Portion
24 Source Electrode
25 Drain Electrode
26 Protective Film
30 Reduced region

The invention claimed is:

1. A thin film transistor provided on a substrate, comprising:
a gate electrode;
a gate insulating film covering the gate electrode;
a semiconductor layer placed to face the gate electrode with the gate insulating film interposed therebetween;
a source electrode connected to the semiconductor layer; and
a drain electrode separated from the source electrode and connected to the semiconductor layer, wherein
the semiconductor layer is comprised of a metal oxide semiconductor including an oxide of at least one of In, Ga, or Zn, and has a source portion that contacts the source electrode, a drain portion that contacts the drain electrode, and a channel portion that is located between the source and drain portions,
a reduced region is formed at least in the channel portion of the semiconductor layer, and the reduced region has a higher content of a simple substance of In than a remaining portion of the semiconductor layer,
the reduced region extends substantially in the entire channel portion,
the metal oxide semiconductor includes an oxide of In, and
the reduced region is a region of the semiconductor layer where an amount of oxygen included in the semiconductor layer has been reduced by a reduction process.

2. A thin film transistor provided on a substrate, comprising:
a gate electrode;
a gate insulating film covering the gate electrode;
a semiconductor layer placed to face the gate electrode with the gate insulating film interposed therebetween;
a source electrode connected to the semiconductor layer; and
a drain electrode separated from the source electrode and connected to the semiconductor layer, wherein
the semiconductor layer is comprised of a metal oxide semiconductor including an oxide of at least one of In, Ga, or Zn, and has a source portion that contacts the source electrode, a drain portion that contacts the drain electrode, and a channel portion that is located between the source and drain portions,
a reduced region is formed at least in the channel portion of the semiconductor layer, and the reduced region has a higher content of a simple substance of In than a remaining portion of the semiconductor layer,
the reduced region is provided in the channel portion, and is present substantially only in a surface region thereof located on an opposite side from the gate electrode in a thickness direction of the channel portion,
the metal oxide semiconductor includes an oxide of In, and
the reduced region is a region of the semiconductor layer where an amount of oxygen included in the semiconductor layer has been reduced by a reduction process.

3. The thin film transistor of claim 2, wherein
the reduced region extends in surface regions of the source portion and the drain portion continuously from the channel portion.

4. The thin film transistor of claim 2, wherein
the content of the simple substance of In in the reduced region is in a range of 3 to 100%.

* * * * *